(12) United States Patent
Huang

(10) Patent No.: US 11,469,181 B2
(45) Date of Patent: Oct. 11, 2022

(54) MEMORY DEVICE WITH AIR GAPS FOR REDUCING CAPACITIVE COUPLING

(71) Applicant: NANYA TECHNOLOGY CORPORATION, New Taipei (TW)

(72) Inventor: Chih-Wei Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 232 days.

(21) Appl. No.: 16/912,093

(22) Filed: Jun. 25, 2020

(65) Prior Publication Data
US 2021/0407908 A1  Dec. 30, 2021

(51) Int. Cl.
*H01L 23/532* (2006.01)
*H01L 27/108* (2006.01)
*H01L 21/768* (2006.01)

(52) U.S. Cl.
CPC ...... *H01L 23/5329* (2013.01); *H01L 21/7682* (2013.01); *H01L 27/10814* (2013.01); *H01L 27/10823* (2013.01); *H01L 27/10855* (2013.01); *H01L 27/10876* (2013.01); *H01L 27/10885* (2013.01); *H01L 21/76805* (2013.01); *H01L 21/76895* (2013.01)

(58) Field of Classification Search
CPC ............. H01L 23/5329; H01L 21/7682; H01L 27/10814; H01L 27/10823; H01L 27/10855; H01L 27/10876; H01L 27/10885; H01L 23/5283; H01L 21/76885; H01L 21/76895; H01L 21/76805
See application file for complete search history.

(56) References Cited

U.S. PATENT DOCUMENTS

| | | | |
|---|---|---|---|
| 2019/0103302 A1* | 4/2019 | Yoon | H01L 27/10885 |
| 2019/0109139 A1* | 4/2019 | Wu | H01L 21/3086 |
| 2019/0348418 A1* | 11/2019 | Hwang | H01L 21/764 |

* cited by examiner

*Primary Examiner* — Patricia D Valenzuela
(74) *Attorney, Agent, or Firm* — Muncy, Geissler, Olds & Lowe, P.C.

(57) ABSTRACT

The present application provides a memory device with air gaps for reducing capacitive coupling. The memory device includes: a substrate, a word line, a bit line, a conductive pillar, a landing pad and a storage capacitor. The substrate has an active region. The word line is formed in the substrate and intersected with the active region. The bit line extends over the substrate and electrically connected to the active region. The conductive pillar is disposed over the substrate and electrically connected to the active region. The conductive pillar and the bit line are located at opposite sides of the word line. The landing pad is disposed on and electrically connected to the conductive pillar. A sidewall of the conductive pillar is laterally recessed from a sidewall of the landing pad. The storage capacitor is disposed over and electrically connected to the landing pad.

14 Claims, 20 Drawing Sheets

MEMORY DEVICE WITH AIR GAPS FOR REDUCING CAPACITIVE COUPLING

TECHNICAL FIELD

The present disclosure relates to a memory device, and more particularly, to a memory device with air gaps for reducing capacitive coupling.

DISCUSSION OF THE BACKGROUND

Semiconductor industry has been developed over the years for creating devices with better performances at competitive or lower cost. These developments have resulted in continuous scaling of semiconductor devices, and can be realized by numerous and mutually supporting advances in semiconductor manufacturing processes, along with advances in materials and new device designs.

Dynamic random access memory (DRAM) is a type of semiconductor device consisting of an array of memory cells each having a field effect transistor and a capacitor. The field effect transistor provides access to the capacitor, and the capacitor is functioned for data storage. As DRAM continuous to be scaled down, space between adjacent memory cells is significantly reduced. As a consequence, parasitic capacitance between adjacent memory cells is increased, and such increase of parasitic capacitance limits the operation speed of DRAM.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In an aspect of the present disclosure, a memory device is provided. The memory device comprises: a substrate, having a first active region and a second active region; a word line, formed in the substrate and intersected with the first and second active regions; a first conductive pillar and a second conductive pillar, disposed over the substrate, and overlapped with and electrically connected to the first and second active regions, respectively, wherein the first and second conductive pillars are arranged along a direction substantially parallel to an extending direction of the word line; a first landing pad and a second landing pad, disposed on the first and second conductive pillars, and overlapped with and electrically connected to the first and second conductive pillars, respectively, wherein sidewalls of the first and second conductive pillars are recessed from sidewalls of the first and second landing pads; and a dielectric layer, laterally surrounding the first and second conductive pillars as well as the first and second landing pads, and having an air gap between the first and second conductive pillars.

In another aspect of the present disclosure, a memory device is provided. The memory device comprises: a substrate, having an active region; an isolation structure, formed in the substrate and laterally surrounding the active region; a word line, formed in the substrate and intersected with the active region; a bit line, extending above the substrate and electrically connected to the active region; a conductive pillar, disposed over the substrate and electrically connected to the active region, wherein the bit line and the conductive pillar are located at opposite sides of the word line, and a top surface of the bit line is aligned with or lower than a bottom surface of the conductive pillar; a landing pad, disposed on and electrically connected to the conductive pillar, wherein a sidewall of the conductive pillar is laterally recessed from a sidewall of the landing pad, and a resistivity of the landing pad is lower than a resistivity of the conductive pillar; and a storage capacitor, disposed over and electrically connected to the landing pad.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
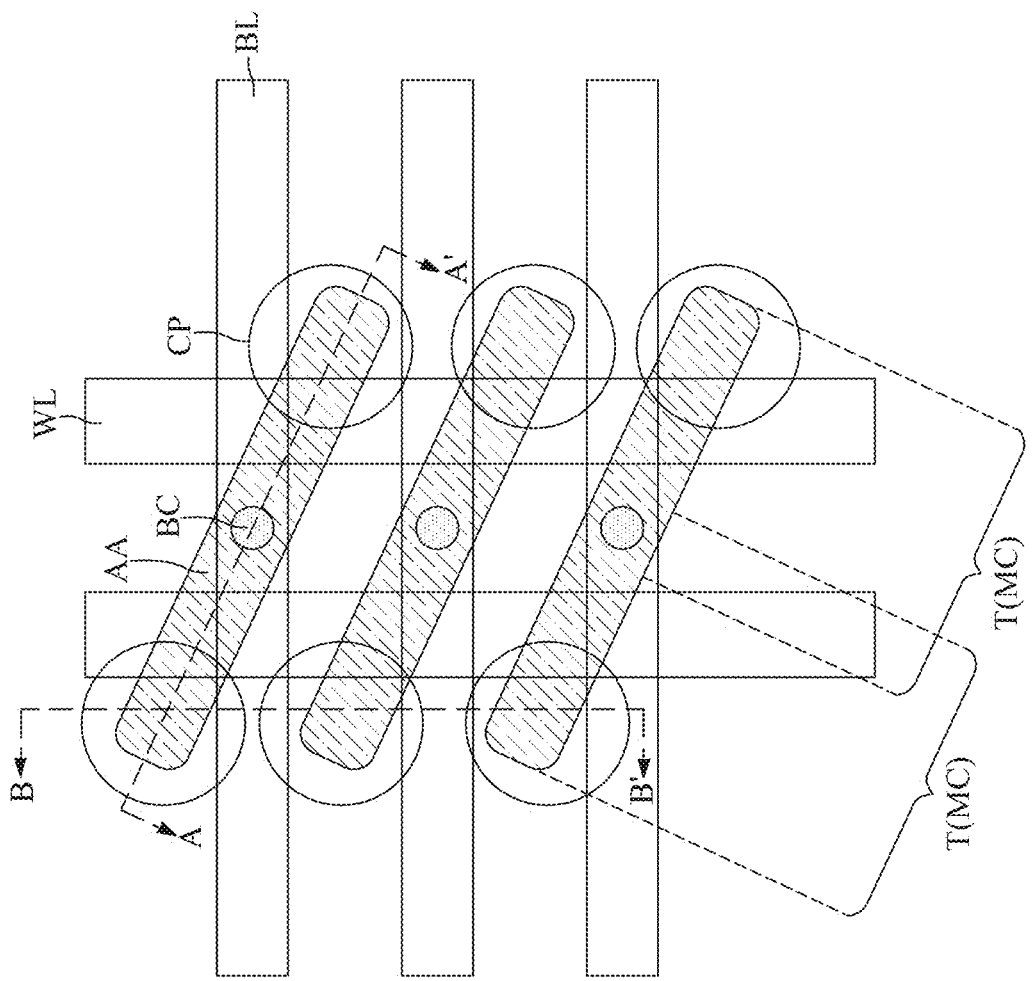
FIG. 1A is a schematic plan view illustrating a memory device according to some embodiments of the present disclosure.
Figure 1A:
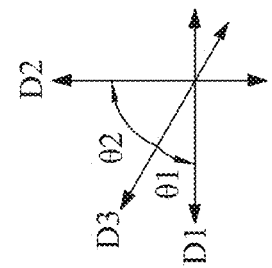

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
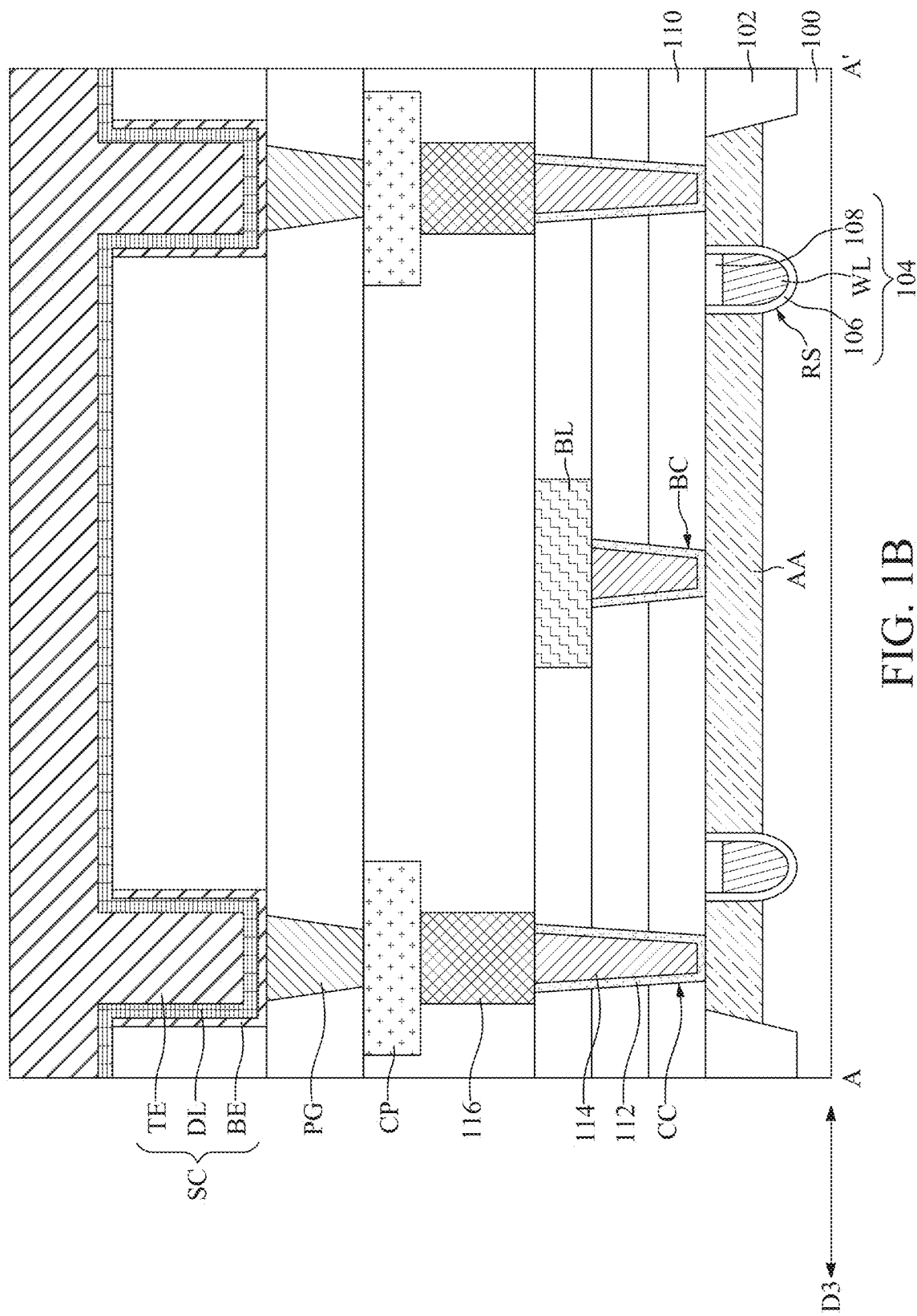
FIG. 1B is a schematic cross-sectional view along an A-A' line shown in FIG. 1A.
Figure 1C:
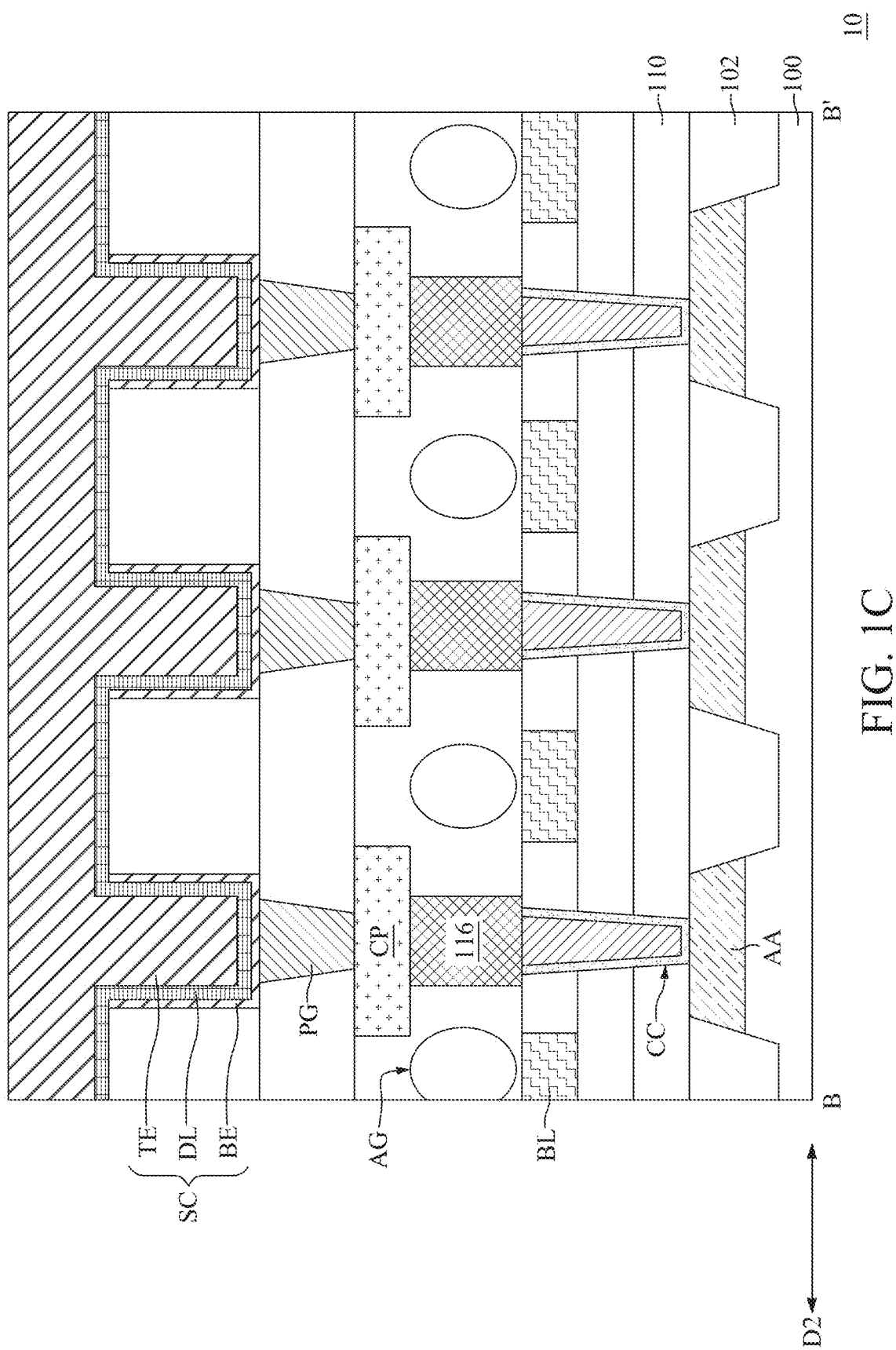
FIG. 1C is a schematic cross-sectional view along a B-B' line shown in FIG. 1A.

FIG. 1A is a schematic plan view illustrating a memory device 10 according to some embodiments of the present disclosure. FIG. 1B is a schematic cross-sectional view along an A-A' line shown in FIG. 1A. FIG. 1C is a schematic cross-sectional view along a B-B' line shown in FIG. 1A. It should be noted that, some of the elements (e.g., the substrate 100, the isolation structure 102, the dielectric layers 110, the capacitor contacts CC, the conductive pillars 116, the capacitor plugs PG, the air gaps AG and the storage capacitor SC) shown in FIG. 1B and FIG. 1C are omitted from FIG. 1A.

Referring to FIG. 1A, in some embodiments, the memory device 10 is a dynamic random access memory (DRAM) device. The memory device 10 includes an array of memory cells MC. It should be noted that, for conciseness, only two columns of memory cells MC are depicted in FIG. 1A. The array of memory cells MC includes active regions AA, word lines WL and bit lines BL. Each memory cell MC consists of a field effect transistor T and a storage capacitor (not shown in FIG. 1A) connected to the field effect transistor T. The field effect transistor T is defined in the vicinity of where one of the active regions AA is intersected with one of the word lines WL. A portion of the word line WL intersected with the active region AA is functioned as a gate terminal of the field effect transistor T, and portions of the active region AA at opposite sides of the word line WL are functioned as source and drain terminals of the field effect transistor T. One of the source and drain terminals is electrically connected to one of the bit lines BL (e.g., through a bit line contact BC). In addition, the other of the source and drain terminals is electrically connected to the storage capacitor. In some embodiments, a landing pad CP is formed between the capacitor (not shown) and the underlying source terminal or drain terminal of the field effect transistor T. In addition, in some embodiments, each active region AA is shared by two of the memory cells MC. In such embodiments, each active region AA is intersected with two of the word lines WL, and the two field effect transistors T sharing the same active region AA are connected with each other by a common source or drain terminal, which is electrically connected to one of the bit lines BL.

The word lines WL extend along a direction D1, and the bit lines BL extend along a direction D2 intersected with the direction D1. In some embodiments, the direction D1 is perpendicular to the direction D2. In addition, in some embodiments, the active regions AA extend along a direction D3 intersected with the direction D1 and the direction D2. However, those skilled in the art may adjust the angles θ1, θ2 according to design requirements, the present disclosure is not limited thereto. Furthermore, those skilled in the art may adjust dimensions of the components shown in FIG. 1A according to process and design requirements, the present disclosure is not limited thereto as well.

Referring to FIG. 1A and FIG. 1B, the active region AA is a region of a substrate 100. The substrate 100 may be a semiconductor wafer or a semiconductor-on-insulator (SOI) wafer. For instance, the semiconductor material in the semiconductor wafer or the SOI wafer may include silicon. In some embodiments, the active region AA is a doped region in the substrate 100, and has a first conductive type (e.g., n-type) or a second conductive type (e.g., p-type) complementary to the first conductive type. As described above, portions of each active region AA at opposite sides of the intersected word line WL are functioned as the source and drain terminals of the corresponding field effect transistor T.

The active regions AA are electrically isolated from one another by an isolation structure 102. In some embodiments, the isolation structure 102 is formed in a recess at a surface of the substrate 100, and is made of an insulating material. In such embodiments, the isolation structure 102, which may also be referred as a trench isolation structure, extends from the surface of the substrate 100 into the substrate 100. A depth of the isolation structure 102 may be greater than a depth of the active region AA, and the active regions AA are laterally separated from one another by the isolation structure 102. It should be noted that, the isolation structure 102 spreads between the active regions AA, and the multiple portions of the isolation structure 102 as depicted in FIG. 1B may actually be connected with one another.

In some embodiments, the word lines WL are formed in recess gate structures 104, respectively. The recess gate structures 104 extend along the direction D2 (shown in FIG. 1A), and are intersected with the active regions AA (as shown in FIG. 1B). In some embodiments, each active region AA is intersected with two of the recess gate structures 104. As shown in FIG. 1B, the recess gate structures 104 are respectively filled in a recess RS at the surface of the substrate 100. A depth of the recess RS may be greater than the depth of the active regions AA, and may be greater than, equal to or less than the depth of the isolation structure 102. In some embodiments, the recess gate structures 104 respectively include a gate dielectric layer 106, one of the word lines WL and an insulating capping layer 108. The gate dielectric layer 106 conformally covers a surface of the recess RS, and an inner surface of the gate dielectric layer 106 defines a recess corresponding to the recess RS of the substrate 100. The word line WL is filled in the recess defined by the inner surface of the gate dielectric layer 106, to a height lower than the surface of the substrate 100. In addition, the insulating capping layer 108 covers a top surface of the word line WL, and extends vertically to a height substantially aligned with the surface of the substrate 100. In other words, the recess defined by the inner surface of the gate dielectric layer 106 is filled up by the word line WL and the insulating capping layer 108.

In some embodiments, the gate dielectric layer 106 is formed of a dielectric material. For instance, the dielectric material may include silicon oxide or a high-k dielectric material having a dielectric constant greater than 3.9 (e.g., hafnium silicate, zirconium silicate, hafnium oxide, zirconium oxide or the like). In addition, in some embodiments, the word line WL may be made of polysilicon, a metal material (e.g., tungsten) or a metal silicide (e.g., nickel silicide, platinum silicide, titanium silicide, molybdenum silicide, cobalt silicide, tantalum silicide, tungsten silicide or the like). Further, in some embodiments, the insulating capping layer 108 may be made of an insulating material, such as silicon oxide, silicon nitride, silicon oxynitride or the like.

A stack of interlayer dielectric layers 110 are formed over the substrate 100, and the active regions AA, the isolation structure 102 and the recess gate structures 104 are covered by the interlayer dielectric layers 110. In addition, the bit line contacts BC and capacitor contacts CC are formed in the stack of interlayer dielectric layers 110. The bit line contacts BC and the capacitor contacts CC respectively penetrate through bottommost ones of the dielectric layers 110, to establish electrical contact with the active regions AA. Each of the bit line contacts BC may be connected to a portion of the corresponding active region AA that is located between the two word lines WL intersected with this active region AA. In other words, the bit line contacts BC are electrically connected to the common source/drain terminals of the transistors T (as shown in FIG. 1A). On the other hand, the capacitor contacts CC are electrically connected to the other source/drain terminal of each transistor T, such that each of the word lines WL is located between one of the bit line contacts BC and one of the capacitor contacts CC. The bit line contacts BC are electrically connected to the bit lines BL, while the capacitor contacts CC are electrically connected to storage capacitors (e.g., the storage capacitors SC to be described). In some embodiments, the bit lines BL are formed at a height lower than a height of the storage capacitors. In such embodiments, the bit line contacts BC may be shorter than the capacitor contacts CC, and top ends of the bit line contacts BC may be lower than top ends of the capacitor contacts CC. For instance, the bit line contacts BC penetrate through two bottommost dielectric layers 110, while the capacitor contacts CC penetrate through three bottommost dielectric layers 110. Furthermore, in some embodiments, the bit line contacts BC and the capacitor contacts CC respectively include a conductive column 112 and a barrier layer 114 covering a sidewall and a bottom surface of the conductive column 112.

In some embodiments, the dielectric layers 110 may be made of a dielectric material. For instance, the dielectric material may include silicon nitride, silicon oxide, silicon oxynitride, undoped silica glass, borosilica glass, phosphosilica glass, borophosphosilica glass, or a combination thereof. In addition, the conductive columns 112 of the bit line contacts BC and the capacitor contacts CC may be made of aluminum, copper, tungsten, cobalt, other suitable metal or metal alloy, and the barrier layer 114 of the bit line contacts BC and the capacitor contacts CC may be, for example, made of tungsten nitride.

The bit lines BL cover and electrically connect to the bit line contacts BC. Although not shown, each of the bit lines BL may cover the bit line contacts BC electrically connected to a row of transistors T, and may extend along the direction D1. As shown in FIG. 1B, the bit lines BL may be formed in one of the dielectric layers 110 above the bit line contacts BC. In some embodiments, topmost portions of the capacitor contacts CC and the bit lines BL are located in the same dielectric layer 110. In such embodiments, top surfaces of the bit lines BL may be substantially coplanar with top surfaces of the capacitor contacts CC. In alternative embodiments, the bit line contacts BC are much shorter than the capacitor contacts CC, and the top surfaces of the bit lines BL may be lower than the top surfaces of the capacitor contacts CC. In addition, in some embodiments, the bit lines BL are made of a conductive material. For instance, the conductive material may include aluminum, copper, tungsten, cobalt, other suitable metal or metal alloy.

Referring to FIG. 1B and FIG. 1C, conductive pillars 116 and landing pads CP are disposed on the capacitor contacts CC. Each of the conductive pillars 116 stands on one of the capacitor contacts CC, and is covered by one of the landing pads CP. A vertical height of the conductive pillars 116 may be greater than a vertical height (or referred as thickness) of the landing pads CP. In some embodiments, a sidewall of each conductive pillar 116 laterally recesses from a sidewall of the overlying landing pad CP. In such embodiments, each conductive pillar 116 has a footprint area smaller than a footprint area of each landing pad CP. In addition, the conductive pillars 116 may be entirely overlapped with the landing pads CP. The conductive pillars 116 and the landing pads CP may be formed in the same dielectric layer 110 covering the capacitor contacts CC. In those embodiments where the top surfaces of the bit lines BL are coplanar with or lower than the top surfaces of the capacitor contacts CC, the bit lines BL are also lying below the conductive pillars 116 and the landing pads CP. As shown in FIG. 1C, a space between adjacent landing pads CP is shorter than a space between adjacent conductive pillars 116. As a consequence, when filling the dielectric layer 110 in these spaces, the smaller spaces between the landing pads CP may be filled up sooner than the larger spaces between the conductive pillars 116. Accordingly, air gaps AG may be formed and sealed in these larger spaces (i.e., formed and sealed between the conductive pillars 116). In some embodiments, the air gaps AG may not expose the sidewalls of the conductive pillars 116, and may not expose the top surfaces of the underlying bit lines BL as well. However, in alternative embodiments, at least some portions of the sidewalls of the conductive pillars 116 and/or at least some portions of the top surfaces of the bit lines BL are exposed by the air gaps AG. In addition, in certain embodiments, the top ends of the air gaps AG may extend to the spaces between the landing pads CP. Further, although the air gaps AG are depicted as oval shapes in FIG. 1C, but the air gaps AG can be formed in other possible shapes, the present disclosure is not limited thereto.

The landing pads CP and the conductive pillars 116 are respectively made of different conductive materials. In some embodiments, a resistivity of the conductive material for forming the landing pads CP is lower than a resistivity of the conductive material for forming the conductive pillars 116, and the conductive material for forming the conductive pillars 116 has a sufficient etching selectivity with respect to the conductive material.

In some embodiments, capacitor plugs PG stand on the landing pads CP, respectively. The capacitor plugs PG may be formed in one of the dielectric layers 110 covering the landing pads CP. Since the landing pads CP respectively have a footprint area greater than a footprint area of the underlying conductive pillar 116, connection between the capacitor plugs PG and the conductive pillars 116 can be established even when the capacitor plugs PG are offset from the conductive pillars 116. In other words, by disposing the landing pads CP, electrical connection between the capacitor contacts CC and the conductive pillars can be ensured. In addition, as described above, the air gaps AG can be formed as a result of disposing the landing pads CP. The capacitor plugs PG are made of a conductive material. For instance, such conductive material may include aluminum, copper, tungsten, cobalt, other suitable metal or metal alloy.

Storage capacitors SC are disposed on and electrically connected to the capacitor plugs PG, respectively. In some embodiments, the dielectric layer 110 lying above the capacitor plugs PG may have openings overlapped with the capacitor plugs PG, and the storage capacitor SC may fill up these openings and may cover a top surface of this dielectric layer 110. The storage capacitors SC may include bottom electrodes BE, a dielectric layer DL and a top electrode TE. The bottom electrodes BE conformally cover a sidewall and a bottom surface of each opening in the dielectric layer 110 lying above the capacitor plugs PG. The bottom electrodes BE are separated from one another, and respectively in electrical connection with one of the capacitor plugs PG. The dielectric layer DL conformally covers surfaces of the bottom electrodes BE and the top surface of the dielectric layer 110 in which the bottom electrodes BE are disposed. The top electrode TE fills up those openings of the aforementioned dielectric layer 110, and may extend onto a topmost surface of the dielectric layer 110. In the embodiments described above, the dielectric layer DL and the top electrode TE are each shared by the storage capacitors SC. The bottom electrodes BE and the top electrode TE are respectively made of a conductive material, while the dielectric layer DL may be made of a high-k dielectric material. For instance, the conductive material for forming the bottom electrodes BE may include doped polysilicon, metal silicide, aluminum, copper or tungsten, while the conductive material for forming the top electrode TE may include doped polysilicon, copper, or aluminum. In addition, the high-k dielectric layer may include barium strontium titanate, lead zirconium titanate, titanium oxide, aluminum oxide, hafnium oxide, yttrium oxide, zirconium oxide or the like.

Referring to FIG. 1A through FIG. 1C, in some embodiments, the storage capacitors SC are electrically connected to the transistors T through the capacitor plugs PG, the landing pads CP, the conductive pillars 116 and the capacitor contacts CC. As shown in FIG. 1A and FIG. 1C, as the size of each memory cell MC decreases, the space between adjacent memory cells MC along the direction D2 may also be reduced. As a consequence, parasitic capacitance between adjacent conductive pillars 116 is increased, and such increase in parasitic capacitance results in greater resistance-capacitance (RC) delay of the memory device 10. As described above, by disposing the landing pads CP each larger than the underlying conductive pillar 116, the air gaps AG can be formed between adjacent conductive pillars 116. Air sealed in the air gaps AG has a dielectric constant approximate 1, which is significantly lower than the dielectric constant of a solid dielectric material (i.e., the dielectric material for forming the dielectric layers 110). Therefore, the parasitic capacitance between the conductive pillars 116 can be lowered by the formation of the air gaps AG, and the RC delay of the memory device 10 can be effectively reduced. As a result, operation speed of the memory device 10 can be improved. In those embodiments where the resistivity of the landing pads CP is lower than the resistivity of the conductive pillars 116, the parasitic capacitance between the landing pads CP may be limited, even though the landing pads CP have a narrower space than the conductive pillars 116.

Figure 2:
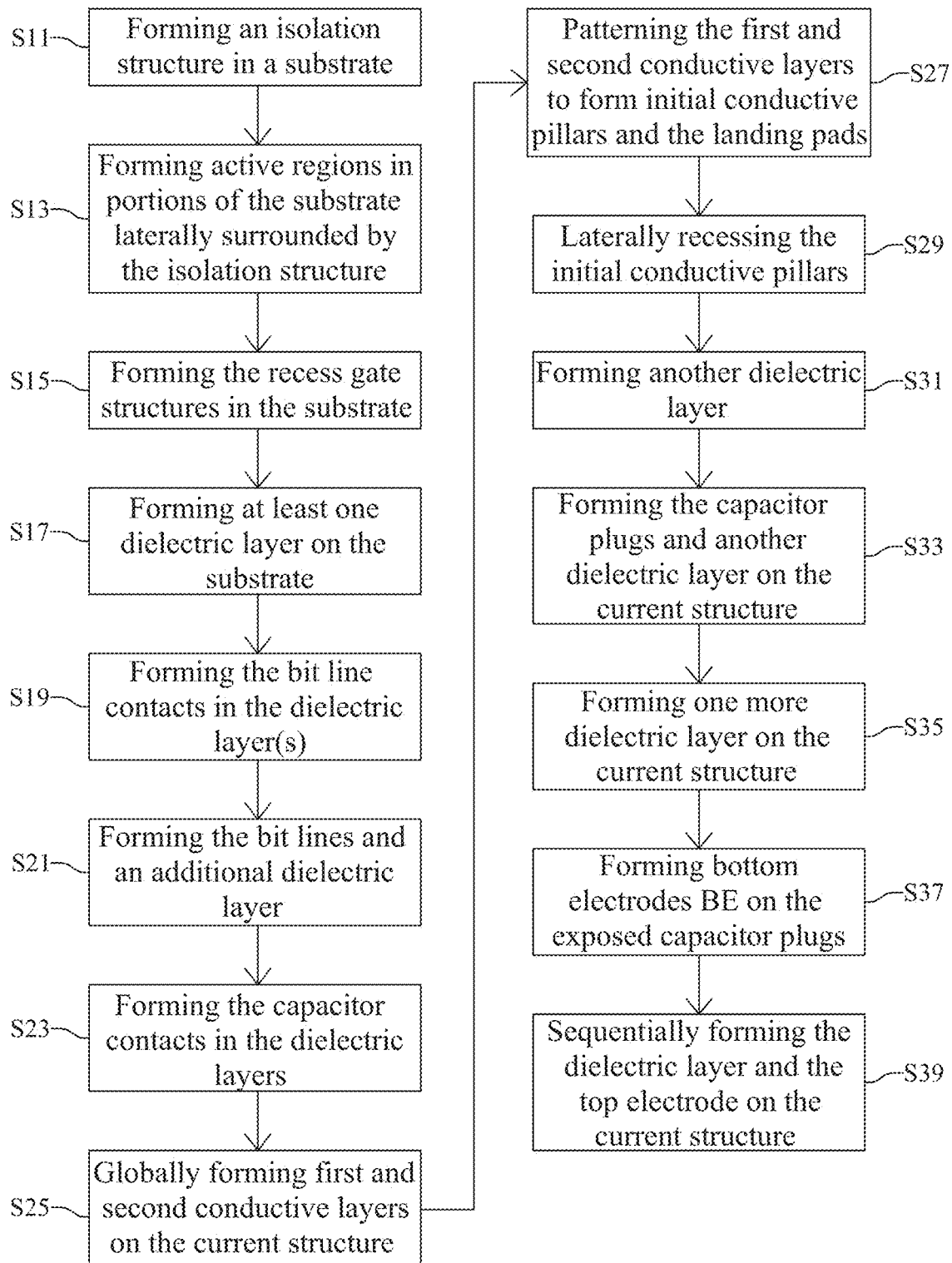
FIG. 2 is a flow diagram illustrating a manufacturing method of a memory device according to some embodiments in the present disclosure.
Figure 3A:
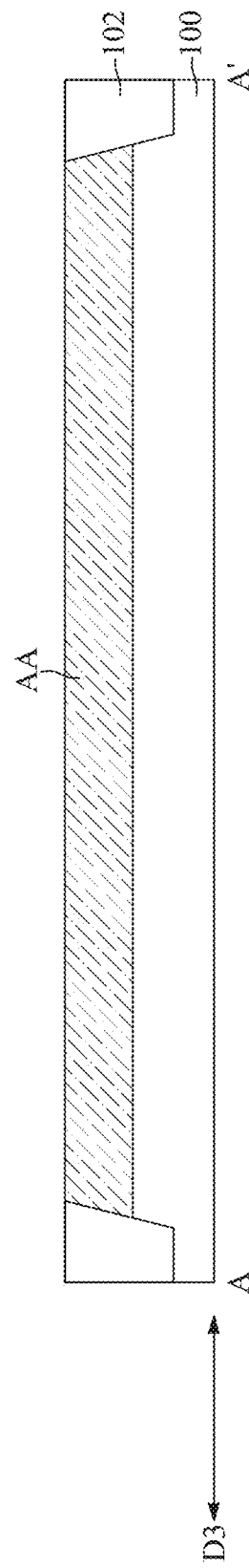
FIG. 3A through FIG. 3N are schematic cross-sectional views illustrating structures at various stages during the manufacturing of the memory device as shown in FIG. 2.

FIG. 2 is a flow diagram illustrating a manufacturing method of the memory device 10 shown in FIG. 1A through FIG. 1C. FIG. 3A through FIG. 3N are schematic cross-sectional views along one of the active regions AA (e.g., along the line A-A' shown in FIG. 1A) in the structures at various stages during the manufacturing of the memory device 10. FIG. 4 is another schematic cross-sectional view (along the line B-B' shown in FIG. 1B) of the structure at the stage illustrated in FIG. 3J.

Referring to FIG. 2 and FIG. 3A, step S11 is performed, and the isolation structure 102 is formed in the substrate 100. The isolation structure 102 defines portions of the substrate 100 to be formed as the active regions AA. In some embodiments, the isolation structure 102 is a trench isolation structure. In such embodiments, a method for forming the isolation structure 102 may include forming a trench at a surface of the substrate 100 by a lithography process and an etching process (e.g., an anisotropic etching process), and filling an insulating material into the trench. Thereafter, a planarization process may be performed to remove portions of this insulating material above the substrate. The remained portion of the insulating material forms the isolation structure 102. For instance, the planarization process described in the present disclosure may include a chemical mechanical polishing (CMP) process, and etching process or a combination thereof.

Thereafter, step S13 is performed, and the active regions AA are formed in the portions of the substrate 100 laterally surrounded by the isolation structure 102. In some embodiments, the active regions AA are formed by an ion implantation process, during which n-type or p-type dopants are implanted into the substrate 100. In such embodiments, the isolation structure 102 may be functioned as a mask during the ion implantation process.

Figure 3B:
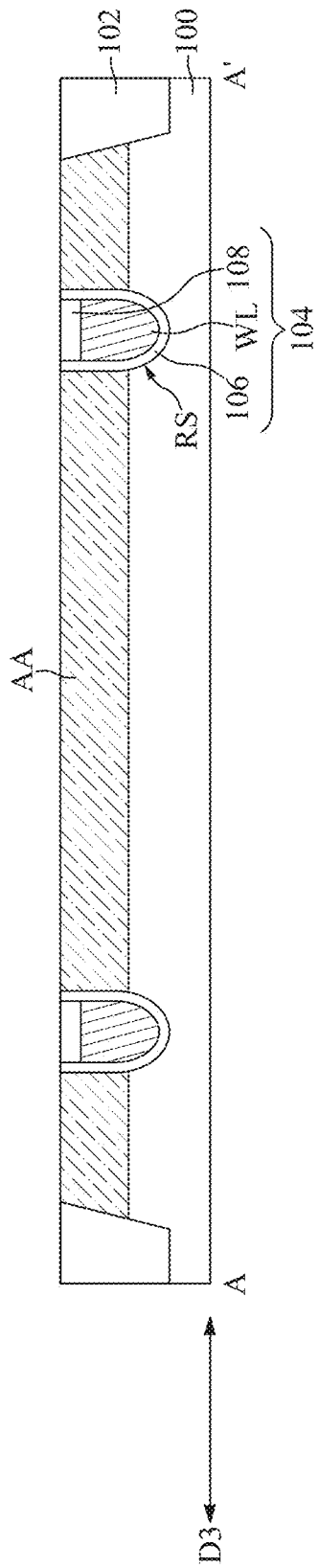

Referring to FIG. 2 and FIG. 3B, step S15 is performed, and the recess gate structures 104 are formed in the substrate 100. As described with reference to FIG. 1A and FIG. 1B, the recess gate structures 104 may be respectively formed in a line shape, and intersected with the active regions AA. In addition, the recess gate structures 104 may respectively include the gate dielectric layer 106, the word line WL and the insulating capping layer 108. In some embodiments, a method for forming the recess gate structures 104 may include forming the recesses RS at the surface of the substrate 100 by using a lithography process and an etching process (e.g., an anisotropic etching process). Thereafter, the gate dielectric layers 106 may be conformally formed in these recesses RS by an oxidation process or a deposition process (e.g., a chemical vapor deposition (CVD) process). A conductive material is subsequently filled in these recesses RS by a deposition process (e.g., a CVD process or a physical vapor deposition (PVD) process), and is etched back to form the word lines WL. Afterwards, an insulating material is further filled in these recesses RS by a deposition process (e.g., a CVD process), and portions of this insulating material above the substrate 100 may be removed by a planarization process, so as to form the insulating capping layers 108.

Figure 3C:
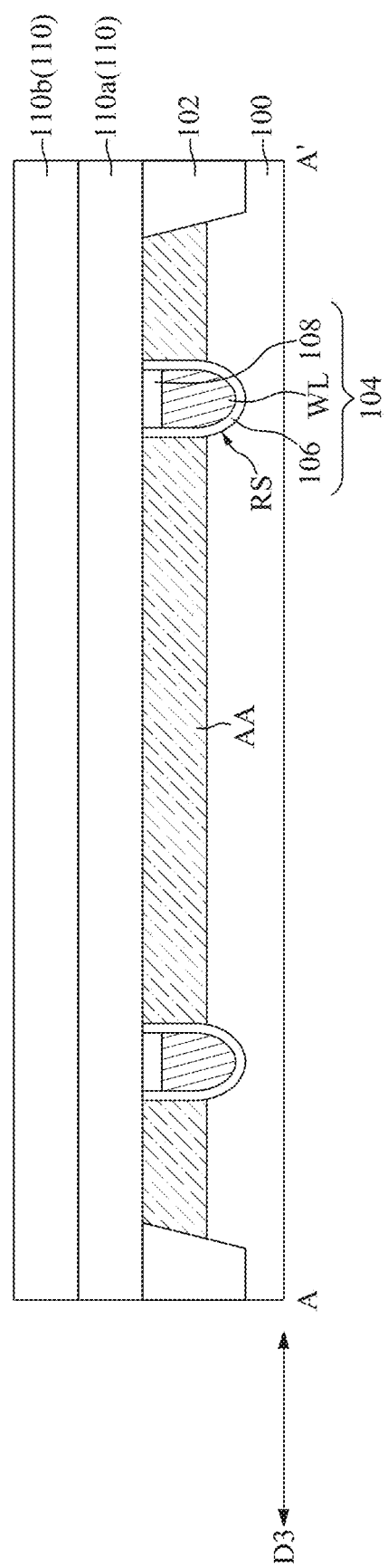

Referring to FIG. 2 and FIG. 3C, step S17 is performed, and at least one dielectric layer 110 is formed on the substrate 100. For instance, two dielectric layers 110 including a dielectric layer 110a and a dielectric layer 110b are formed on the substrate 100. In some embodiments, a method for forming the dielectric layers 110a, 110b includes a deposition process (e.g., a CVD process).

Figure 3D:
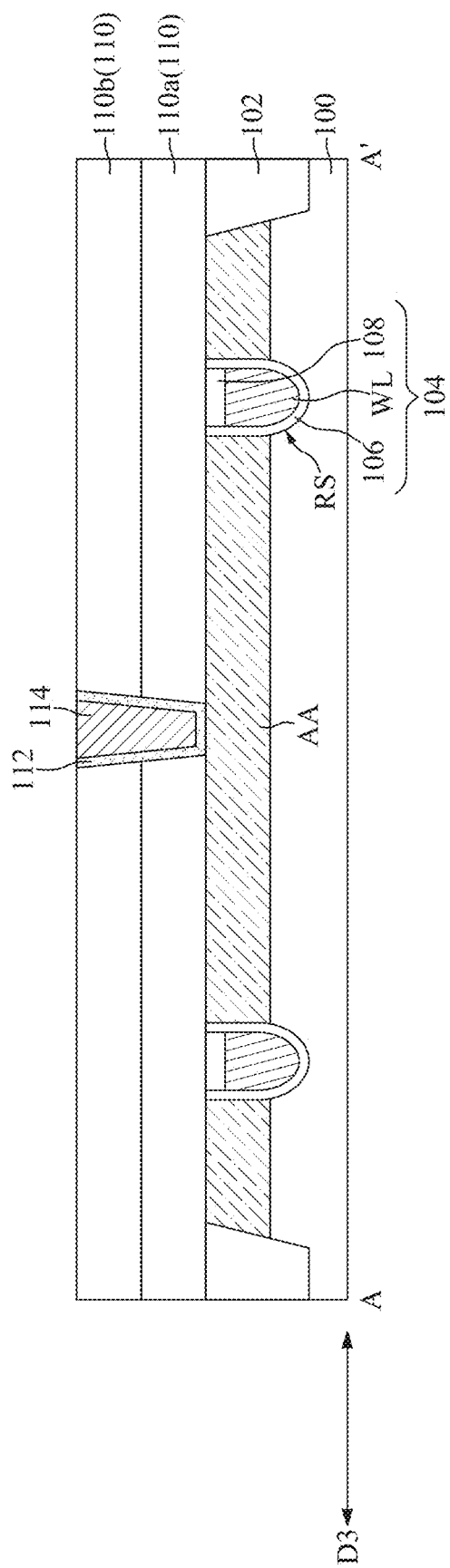

Referring to FIG. 2 and FIG. 3D, step S19 is performed, and the bit line contacts BC are formed in the previously formed dielectric layer(s) 110 (e.g., the dielectric layers 110a, 110b). In some embodiments, the bit line contacts BC may respectively include the conductive column 112 and the barrier layer 114. In such embodiments, a method for forming the bit line contacts BC may include forming via holes in the dielectric layer(s) 110 (e.g., the dielectric layers 110a, 110b) by a lithography process and an etching process (e.g., an anisotropic etching process). Subsequently, the barrier layers 114 are conformally formed in the via holes by a deposition process (e.g., a CVD process), and the conductive columns 112 are further filled in the via holes by another deposition process (e.g., a CVD process) or a plating process. For instance, the plating process described in the present disclosure may include an electroplating process or an electro-less plating process. In addition, a planarization process may be performed to remove materials of the conductive columns 112 and the barrier layers 114 outside the via holes.

Figure 3E:
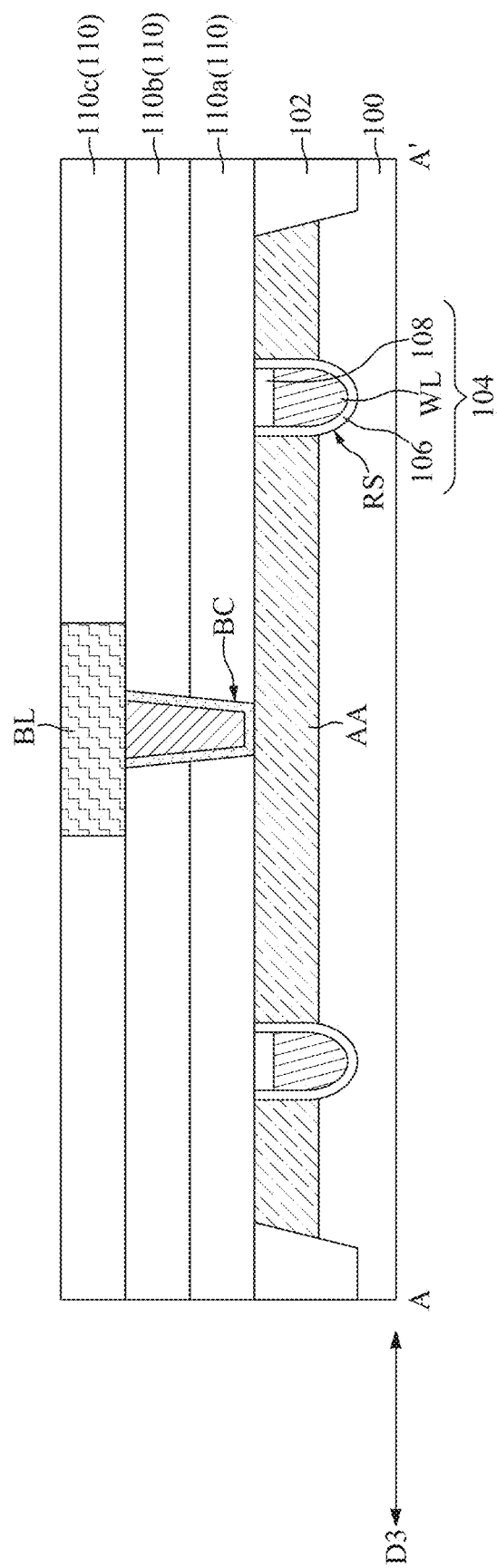

Referring to FIG. 2 and FIG. 3E, step S21 is performed, and the bit lines BL and an additional dielectric layer 110 (e.g., a dielectric layer 110c) are formed on the current structure. In some embodiments, a method for forming the bit lines BL may include forming trenches in the dielectric layer 110c, and filling a conductive material into these trenches by a deposition process (e.g., a PVD process), a plating process or a combination thereof. In addition, a planarization process may be performed to remove portions of the conductive material above the dielectric layer 110c, and the remained portions of the conductive material form the bit lines BL.

Figure 3F:
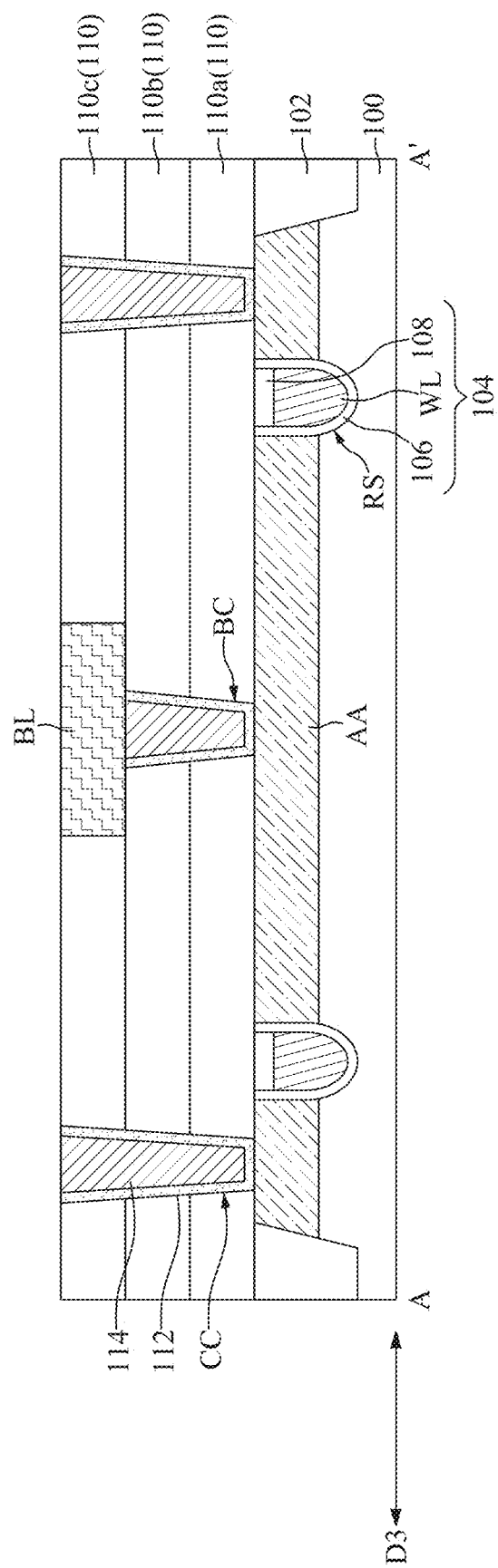

Referring to FIG. 2 and FIG. 3F, step S23 is performed, and the capacitor contacts CC are formed in the dielectric layers 110 (e.g., the dielectric layers 110a-110c). In some embodiments, a method for forming the capacitor contacts CC is similar to the method for forming the bit line contacts BC, except that deeper via holes are formed for accommodating the capacitor contacts CC.

Figure 3G:
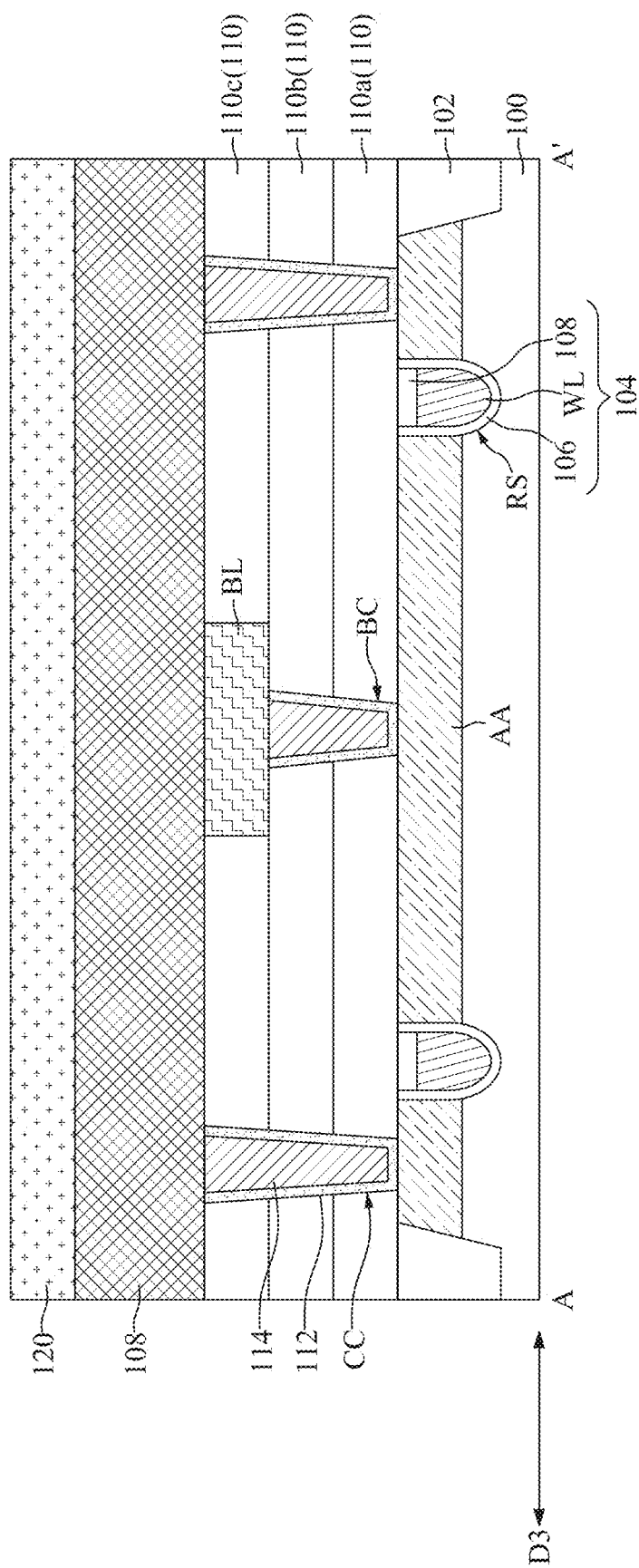

Referring to FIG. 2 and FIG. 3G, step S25 is performed, and first and second conductive layers 118, 120 are globally formed on the current structure. In other words, the capacitor contacts CC, the bit lines BL and the current topmost dielectric layer 110 (e.g., the dielectric layer 110c) may be covered by the first and second conductive layers 118, 120. The second conductive layer 120 is stacked on the first conductive layer 118. The conductive pillars 116 and the landing pads CP will be formed by patterning the first and second conductive layers 118, 120 in the following steps. In some embodiments, the first conductive layer 118 has a thickness greater than a thickness of the second conductive layer 120. In addition, in some embodiments, a conductive material for forming the second conductive layer 120 has a resistivity lower than a resistivity of the conductive material for forming the first conductive layer 118, and the conductive material for forming the first conductive layer 118 has a sufficient etching selectivity with respect to the conductive material for forming the second conductive layer 120. A method for forming each of the conductive layers 118, 120 may include a deposition process (e.g., a PVD process), a plating process or a combination thereof.

Figure 3H:
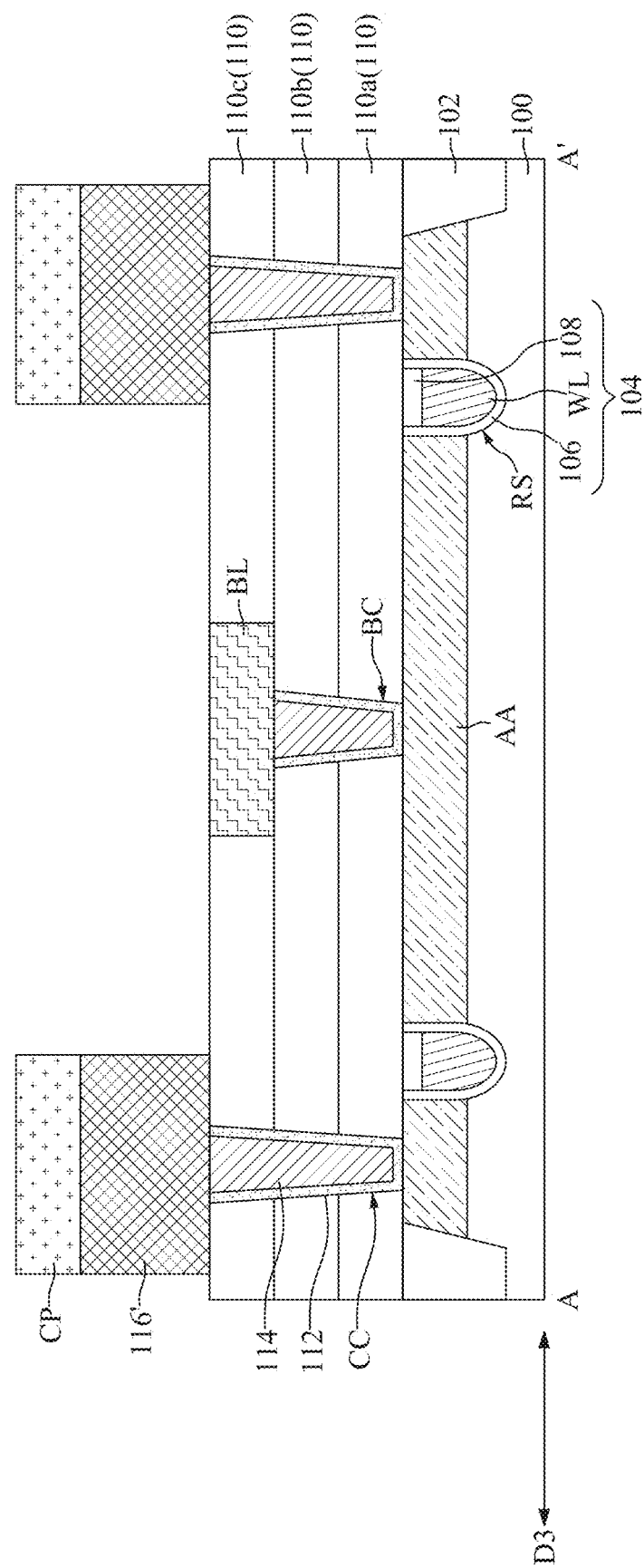

Referring to FIG. 2 and FIG. 3H, step S27 is performed, and the first and second conductive layers 118, 120 are patterned to form initial conductive pillars 116' and the landing pads CP. During such patterning, portions of the first and second conductive layers 118, 120 are removed, and the bit lines BL as well as portions of the current topmost dielectric layer 110c may be exposed. Sidewalls of the formed initial conductive pillars 116' may be substantially coplanar with sidewalls of the formed landing pads CP. In other words, a footprint area of each initial conductive pillar 116' may be substantially identical with a footprint area of the overlying landing pad CP. The conductive pillars 116 will be formed by laterally recessing the initial conductive pillars 116' in the following step. In some embodiments, a method for forming the initial conductive pillars 116' and the landing pads CP may include a lithography process and a single etching process (e.g., a single anisotropic etching process). In these embodiments, the first and second conductive layers 118, 120 are partially removed in the same etching process. In alternative embodiments, a method for forming the initial conductive pillars 116' and the landing pads CP uses two etching processes (e.g., two anisotropic etching processes). A first etching process is performed for forming the landing pads CP, and a following second etching process is performed for forming the initial conductive pillars 116'.

Figure 3I:
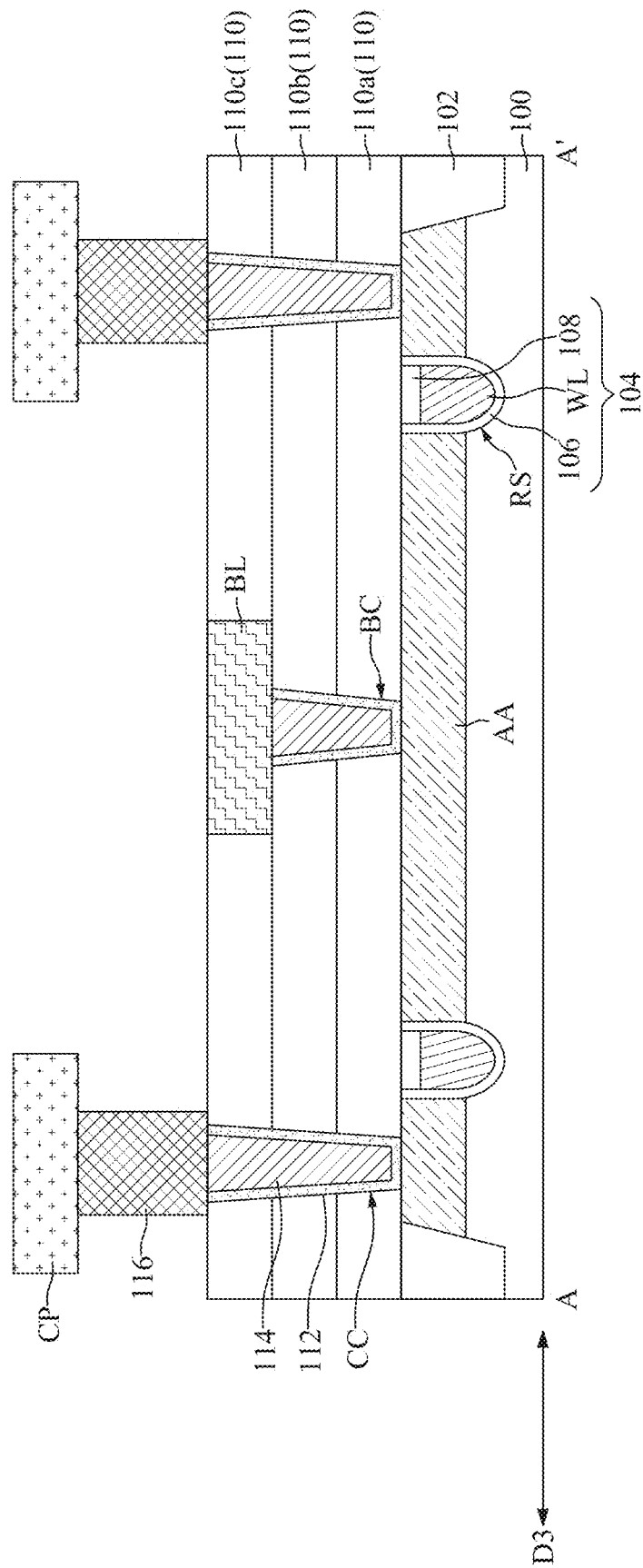

Referring to FIG. 2 and FIG. 3I, step S29 is performed, and the initial conductive pillars 116' are laterally recessed, so as to form the conductive pillars 116. In some embodiments, a method for lateral recessing the initial conductive pillars 116' includes an isotropic etching process (e.g., a wet etching process). In those embodiments where the conductive material for forming the landing pads CP has a sufficient etching selectivity with respect to the conductive material for forming the initial conductive pillars 116', the landing pads CP may avoid from being damaged (or may be slightly consumed) during such isotropic etching process. As a consequence, the formed conductive pillars 116 can be laterally recessed with respect to the landing pads CP. In addition, in some embodiments, the conductive material for forming the bit lines BL also has an etching selectivity with respect to the conductive material for forming the initial conductive pillars 116', and the bit lines BL may be undamaged (or slightly consumed) during the isotropic etching process.

Figure 3J:
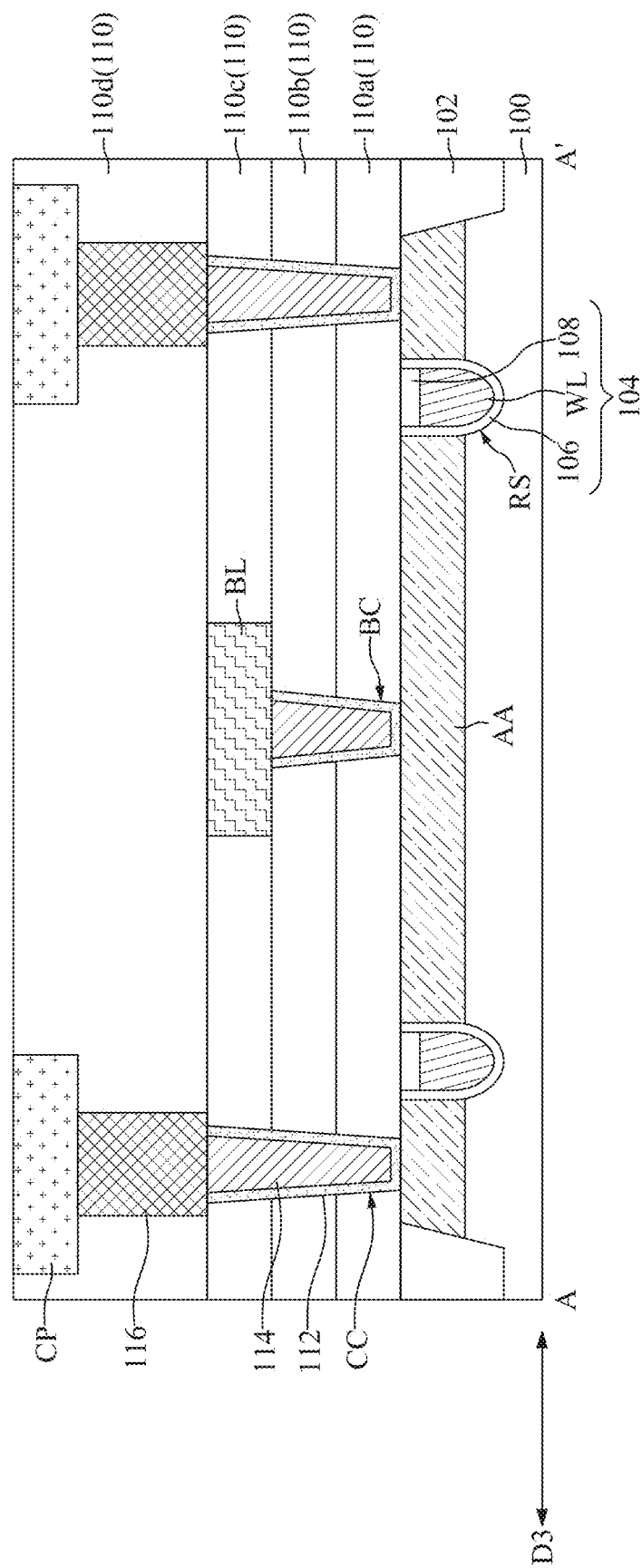
Figure 3K:
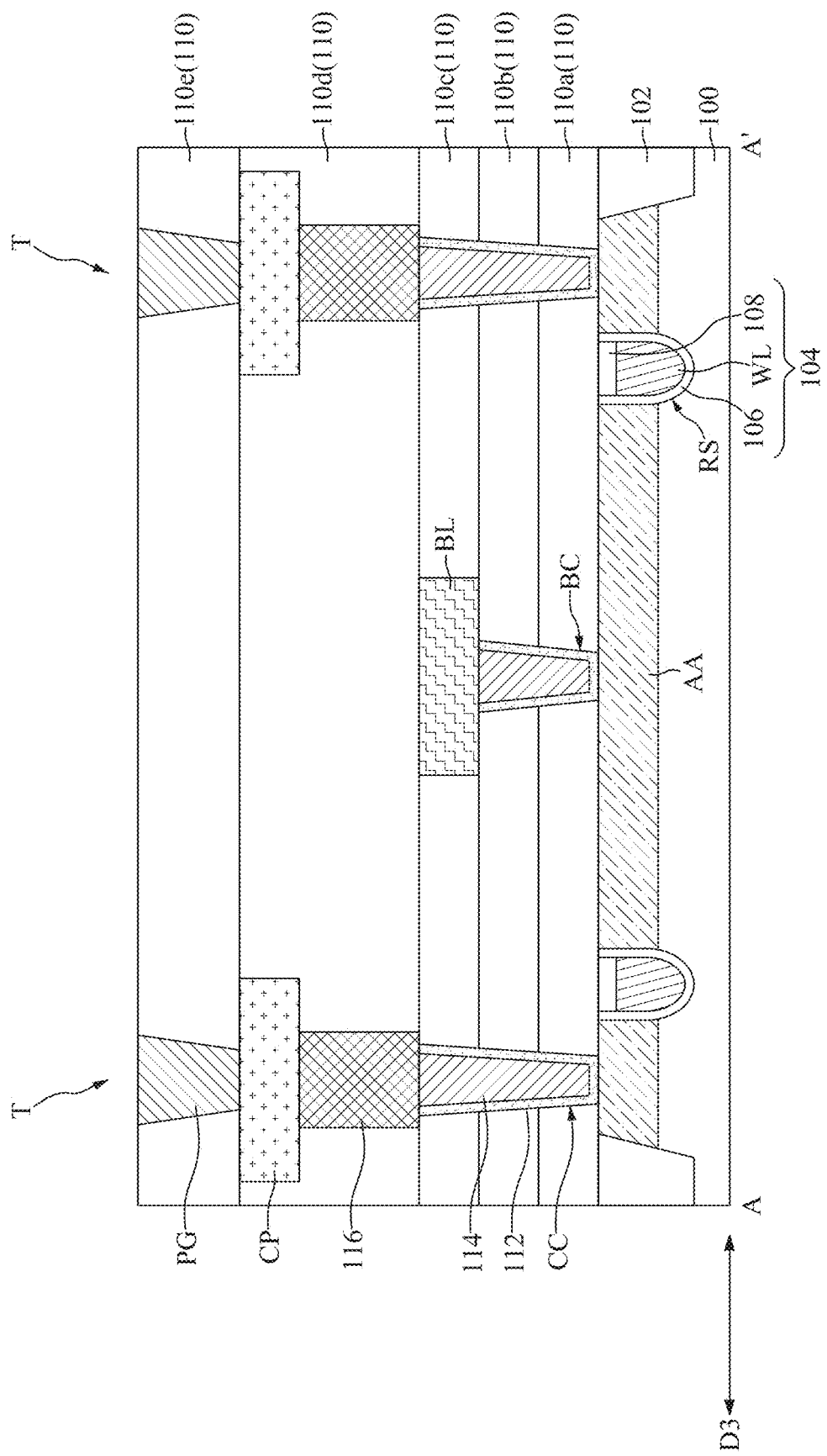
Figure 3L:
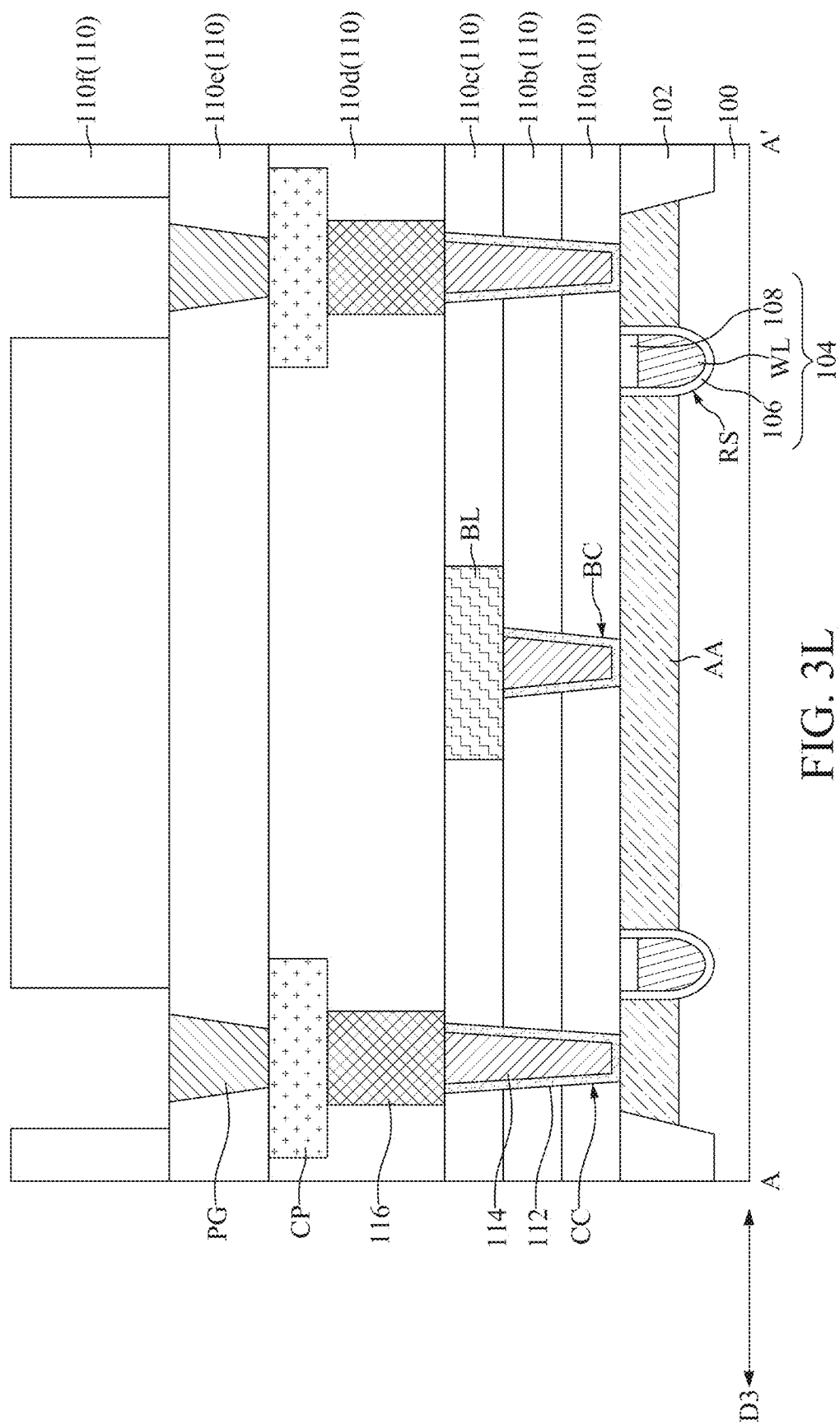
Figure 3M:
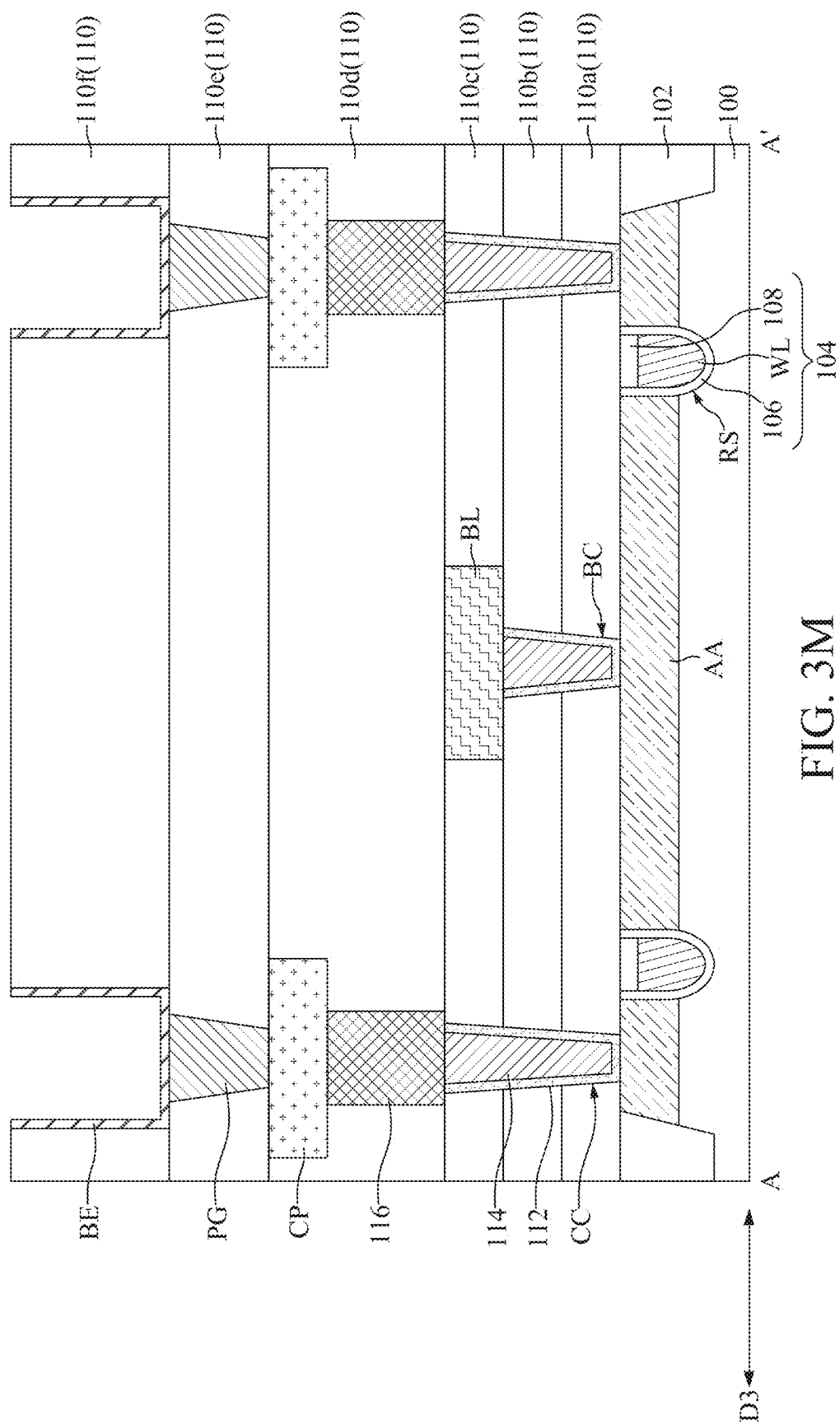
Figure 3N:
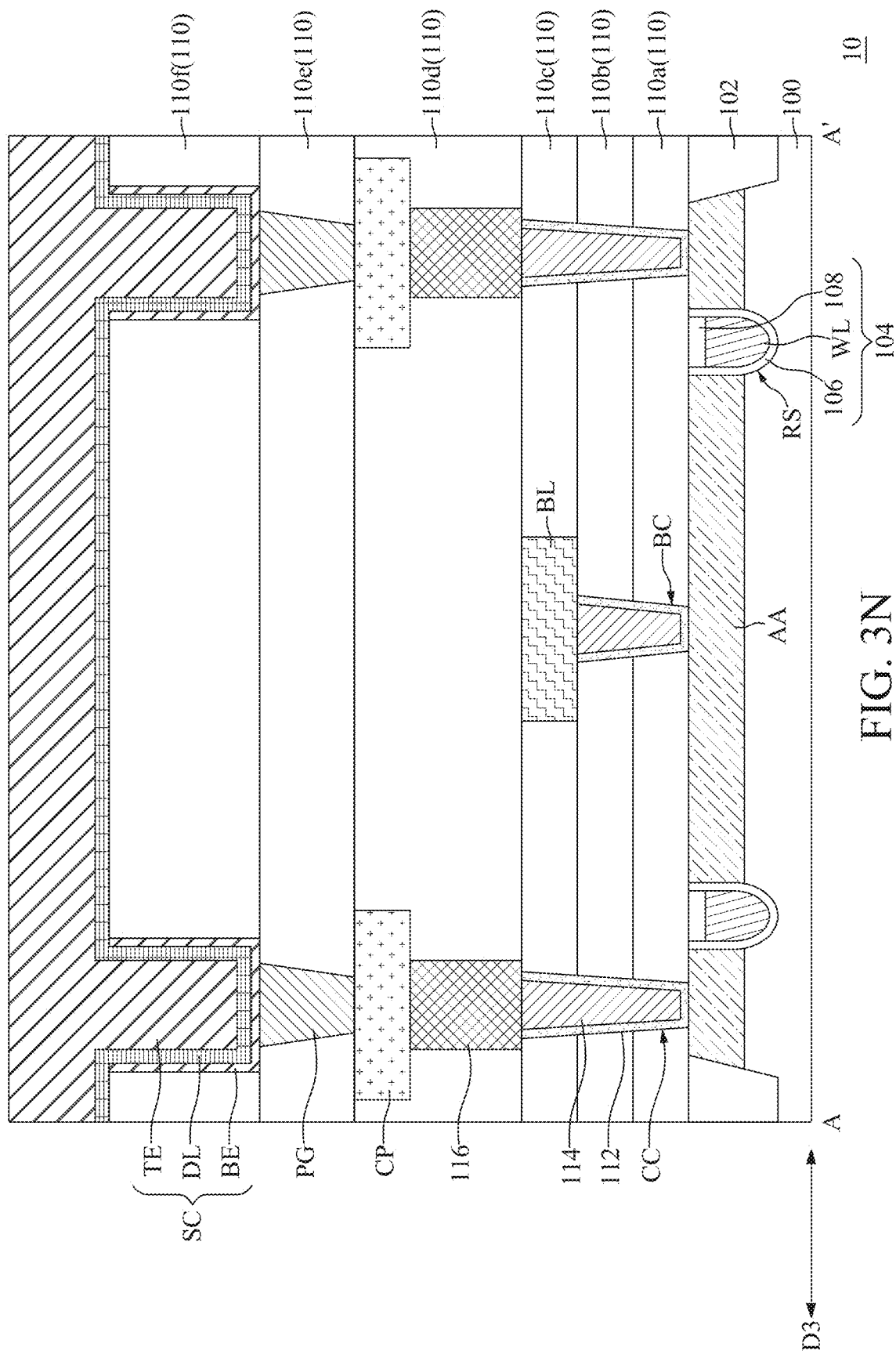
Figure 4:
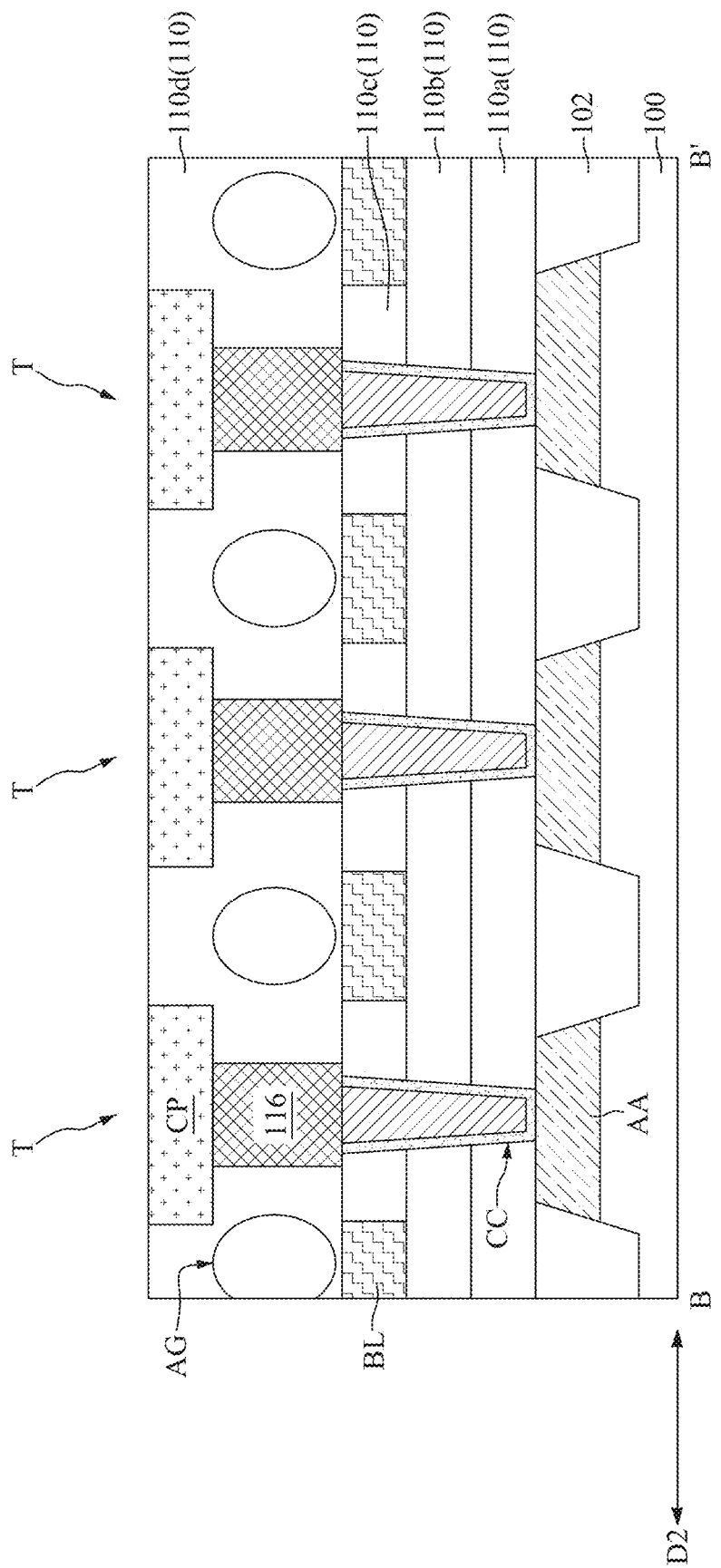
FIG. 4 is another schematic cross-sectional view of the structure at the stage illustrated in FIG. 3J.

Referring to FIG. 2, FIG. 3J and FIG. 4, step S31 is performed, and another dielectric layer 110 (e.g., a dielectric layer 110d) is formed. The conductive pillars 116 and the landing pads CP form stacking structures T on the capacitor contacts CC, and define recesses in between. The dielectric layer 110d is filled in the recesses defined by the stacking structures T. In some embodiments, a method for forming the dielectric layer 110d includes a deposition process (e.g., a CVD process), and may further include a planarization process for removing excess material above the landing pads CP. As shown in FIG. 3 and FIG. 4, in some embodiments, a width of the recess between adjacent stacking structures T arranged along a column direction (i.e., the direction D2) is much shorter than a width of the recess between adjacent stacking structures T arranged along an extending direction of the active regions AA (i.e., the direction D3). As shown in FIG. 4, the dielectric layer 110d may not completely fill up the narrow recesses arranged along the column direction (i.e., the direction D2). Since the conductive pillars 116 are laterally recessed from the landing pads CP, a space between adjacent landing pads CP is shorter than a space between adjacent conductive pillars T. In other words, the recesses defined between the stacking structures T respectively have a relatively narrow top portion and a relatively wide bottom portion. When the dielectric layer 110d is filled in those narrow recesses (the recesses arranged along the direction D2), the relatively narrow top portions of these recesses may be sealed before the relatively wide bottom portions of these recesses could be completely filled. As a consequence, the air gaps AG may be formed in these relatively wide bottom portions. In other words, the possibly formed air gaps AG are located between the conductive pillars 116 arranged along the column direction (i.e., the direction D2). As dimensions of the recesses, deposition conditions, and other parameters vary, the air gaps AG may be formed in different shapes, and top ends of the air gaps AG may or may not extend over top ends of the conductive pillars 116. In some embodiments, the air gaps AG may not expose sidewalls of the conductive pillars 116 nor top surfaces of the bit lines BL. In alternative embodiments, some portions of the conductive pillars 116 and/or some portions of the bit lines BL may be exposed by the air gaps AG.

Referring to FIG. 2 and FIG. 3K, step S33 is performed, and the capacitor plugs PG and another dielectric layer 110 (e.g., a dielectric layer 110e) are formed on the current structure. The dielectric layer 110e is located on the dielectric layer 110d and the landing pads CP, and the capacitor plugs PG penetrate through the dielectric layer 110e to establish electrical connection with the landing pads CP. In some embodiments, a dielectric material layer may be globally formed on the dielectric layer 110d and the landing pads CP by a deposition process (e.g., a CVD process), then through holes are formed in the dielectric material layer by a lithography process and an etching process (e.g., an anisotropic etching process), to form the dielectric layer 110e. Subsequently, a conductive material is filled in these through holes by a deposition process (e.g., a PVD process), a plating process or a combination thereof, and a planarization process may be performed to remove portions of the conductive material over the dielectric layer 110e. The remained portions of the conductive material form the capacitor plugs PG.

Referring to FIG. 2, FIG. 3L, step S35 is performed, and one more dielectric layer 110 (e.g., a dielectric layer 110f) is formed on the current structure. The dielectric layer 110f is located on the dielectric layer 110e, and has openings overlapped with the capacitor plugs PG. In some embodiments, these openings further overlap portions of the dielectric layer 110e surrounding the capacitor plugs PG. In some embodiments, a dielectric material layer may be globally formed on the dielectric layer 110e and the capacitor plugs PG by a deposition process (e.g., a CVD process), then openings (as shown in FIG. 3L) are formed in the dielectric material layer by a lithography process and an etching process (e.g., an anisotropic etching process), to form the dielectric layer 110f.

Referring to FIG. 2 and FIG. 3M, step S37 is performed, and the bottom electrodes BE are formed on the exposed capacitor plugs PG. The bottom electrodes BE are conformally formed in the openings of the dielectric layer 110f, and are separated from one another. Accordingly, the capacitor plugs PG cover the capacitor plugs PG, and establish electrical connection with the capacitor plugs PG. In embodiments where the openings of the dielectric layer 110f further overlap portions of the dielectric layer 110e surrounding the capacitor plugs PG, these portions of the dielectric layer 110e are covered by the bottom electrodes BE as well. In some embodiments, a conductive material layer is conformally formed to cover surfaces of the dielectric layer 110f as well as exposed surfaces of the capacitor plugs PG and the dielectric layer 110e. Thereafter, a planarization process is performed to remove portions of this conductive material layer over the dielectric layer 110f. The remained portions of this conductive material layer form the bottom electrodes BE.

Referring to FIG. 2 and FIG. 3N, step S39 is performed, and the dielectric layer DL and the top electrode TE are sequentially formed on the current structure. The dielectric layer DL conformally covers exposed surfaces of the dielectric layer 110f and the bottom electrodes BE. The top electrode TE fills up the openings of the dielectric layer 110f, and cover a top surface of the dielectric layer DL. In some embodiments, the dielectric layer DL and the top electrode TE are globally formed. In such embodiments, the storage capacitors SC share the same dielectric layer DL and the same top electrode TE, but include separate bottom electrodes BE. A method for forming the dielectric layer DL may include a deposition process (e.g., a CVD process), while a method for forming the top electrode TE may include a deposition process (e.g., a PVD process), a plating process or a combination thereof.

So far, the memory device 10 has been formed by a manufacturing method according to some embodiments of the present disclosure. Moreover, the memory device 10 may be subjected to further manufacturing processes and/or testing processes.

Figure 5:
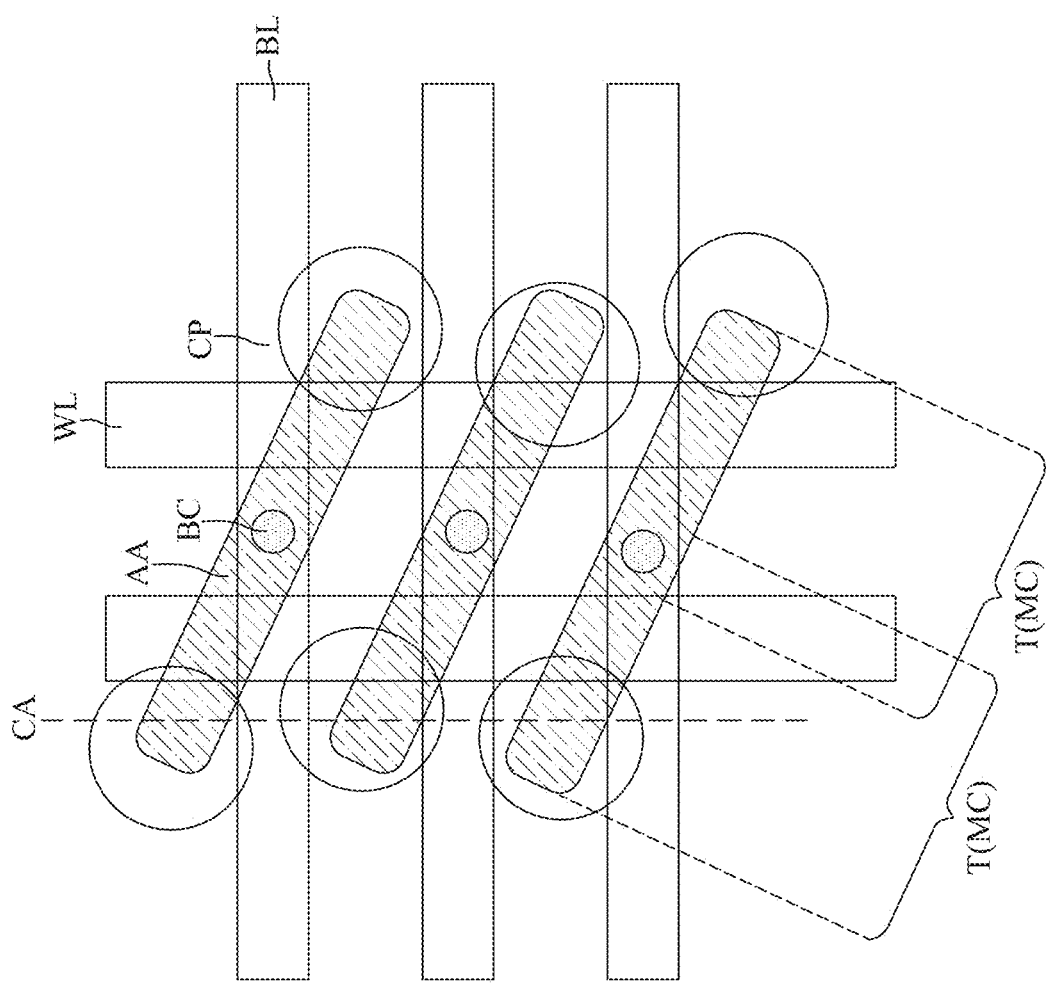
FIG. 5 is a schematic plan view illustrating a memory device according to some alternative embodiments of the present disclosure.
Figure 5:
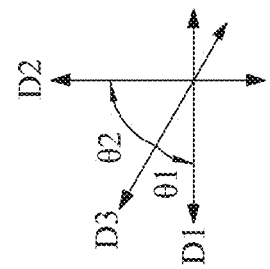

FIG. 5 is a schematic plan view illustrating a memory device 10a according to some alternative embodiments of the present disclosure. The memory device 10a shown in FIG. 5 is similar to the memory device 10 described with reference to FIG. 1A through FIG. 1C. Only differences therebetween will be described, the same or the like parts would not be repeated again. In addition, it should be noted that, some of the elements (e.g., the substrate 100, the isolation structure 102, the dielectric layers 110, the capacitor contacts CC, the conductive pillars 116, the capacitor plugs PG, the air gaps AG and the storage capacitor SC as shown in FIG. 1B and FIG. 1C) of the memory device 10a are omitted from FIG. 5.

Referring to FIG. 5, in some embodiments, each row of the landing pads CP is offset from an adjacent row of the landing pads CP along the direction D1. In addition, offset directions of each row of the landing pads CP from the closest two adjacent rows of the landing pads CP are opposite to each other. As such, in each column of the landing pads CP, the landing pads CP are alternately offset from a central axis CA to the right and left of the central axis CA. In these embodiments, locations of the conductive pillars 116 (not shown) standing below the landing pads CP may or may not offset form the central axes CA. By disposing the landing pads CP with such configuration, density of the memory cells MC can be increased without reducing sizes of the landing pads CP.

As above, the memory device according to embodiments of the present disclosure includes memory cells arranged as an array. Each memory cell includes a transistor and storage capacitor connected to the transistor. A conductive pillar and a landing pad are disposed between one of the storage capacitors and the active region of the transistor connected to this storage capacitor. The landing pad is disposed on the conductive pillar, and a sidewall of the conductive pillar is recessed from a sidewall of the landing pad. Therefore, a space between the landing pads from adjacent memory cells is shorter than a space between the conductive pillars from adjacent memory cells. As a result, while filling a dielectric material in between the stacking structures each including one of the conductive pillars and the overlying landing pad, the space between adjacent landing pads may be sealed before the space between adjacent conductive pillars is filled up. Consequently, air gaps may be formed between the conductive pillars. Due to the low dielectric constant of the air sealed in the air gaps, the parasitic capacitance between the conductive pillars can be lowered by the formation of the air gaps, thus RC delay of the memory device can be effectively reduced. As a result, operation speed of the memory device can be improved. In those embodiments where a resistivity of the landing pads is lower than a resistivity of the conductive pillars, the parasitic capacitance between the landing pads may be limited, even though the landing pads have a narrower space than the conductive pillars.

In an aspect of the present disclosure, a memory device is provided. The memory device comprises: a substrate, having a first active region and a second active region; a word line, formed in the substrate and intersected with the first and second active regions; a first conductive pillar and a second conductive pillar, disposed over the substrate, and overlapped with and electrically connected to the first and second active regions, respectively, wherein the first and second conductive pillars are arranged along a direction substantially parallel to an extending direction of the word line; a first landing pad and a second landing pad, disposed on the first and second conductive pillars, and overlapped with and electrically connected to the first and second conductive pillars, respectively, wherein sidewalls of the first and second conductive pillars are recessed from sidewalls of the first and second landing pads; and a dielectric layer, laterally surrounding the first and second conductive pillars as well as the first and second landing pads, and having an air gap between the first and second conductive pillars.

In another aspect of the present disclosure, a memory device is provided. The memory device comprises: a substrate, having an active region; an isolation structure, formed in the substrate and laterally surrounding the active region; a word line, formed in the substrate and intersected with the active region; a bit line, extending above the substrate and electrically connected to the active region; a conductive pillar, disposed over the substrate and electrically connected to the active region, wherein the bit line and the conductive pillar are located at opposite sides of the word line, and a top surface of the bit line is aligned with or lower than a bottom surface of the conductive pillar; a landing pad, disposed on and electrically connected to the conductive pillar, wherein a sidewall of the conductive pillar is laterally recessed from a sidewall of the landing pad, and a resistivity of the landing pad is lower than a resistivity of the conductive pillar; and a storage capacitor, disposed over and electrically connected to the landing pad.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A memory device, comprising:
    a substrate, having a first active region and a second active region;
    a word line, formed in the substrate and intersected with the first and second active regions;
    a first conductive pillar and a second conductive pillar, disposed over the substrate, and overlapped with and electrically connected to the first and second active regions, respectively, wherein the first and second conductive pillars are arranged along a direction substantially parallel to an extending direction of the word line;
    a first landing pad and a second landing pad, disposed on the first and second conductive pillars, and overlapped with and electrically connected to the first and second conductive pillars, respectively, wherein sidewalls of the first and second conductive pillars are recessed from sidewalls of the first and second landing pads, wherein the first and second landing pads and the first and second conductive pillars are respectively made of different conductive materials, and a resistivity of the first and second landing pads is lower than a resistivity of the first and second conductive pillars; and
    a dielectric layer, laterally surrounding the first and second conductive pillars as well as the first and second landing pads, and having an air gap between the first and second conductive pillars.

2. The memory device according to claim 1, wherein the first and second conductive pillars as well as the first and second landing pads are located at the same side of the word line.

3. The memory device according to claim 1, wherein a space between the first and second landing pads is sealed by the dielectric layer.

4. The memory device according to claim 1, wherein a footprint area of the first landing pad is greater than a footprint area of the first conductive pillar, and a footprint area of the second landing pad is greater than a footprint area of the second conductive pillar.

5. The memory device according to claim 1, wherein a lateral distance between the first and second landing pads is shorter than a lateral distance between the first and second conductive pillars.

6. The memory device according to claim 1, wherein
    the first landing pad is offset from the second landing pad toward a direction perpendicular to the extending direction of the word line.

7. The memory device according to claim 1, further comprising:
    a first contact structure and a second contact structure, disposed between the substrate and the first and second conductive pillars, wherein the first contact structure is electrically connected to and overlapped with the first active region and the first conductive pillar, and the second contact structure is electrically connected to and overlapped with the second active region and the second conductive pillar.

8. The memory device according to claim 1, further comprising:
    a first capacitor plug and a second capacitor plug, disposed on and electrically connected to the first and second landing pads, respectively; and
    a first storage capacitor and a second capacitor, disposed on and electrically connected to the first and second capacitor plugs, respectively.

9. The memory device according to claim 8, wherein a footprint area of the first landing pad is greater than a footprint area of the first capacitor plug, and a footprint area of the second landing pad is greater than a footprint area of the second capacitor plug.

10. A memory device, comprising:
    a substrate, having an active region;
    an isolation structure, formed in the substrate and laterally surrounding the active region;
    a word line, formed in the substrate and intersected with the active region;

a bit line, extending above the substrate and electrically connected to the active region;

a conductive pillar, disposed over the substrate and electrically connected to the active region, wherein the bit line and the conductive pillar are located at opposite sides of the word line, and a top surface of the bit line is aligned with or lower than a bottom surface of the conductive pillar;

a landing pad, disposed on and electrically connected to the conductive pillar, wherein a sidewall of the conductive pillar is laterally recessed from a sidewall of the landing pad, and wherein the landing pad and the conductive pillar are respectively made of different conductive materials, and a resistivity of the landing pad is lower than a resistivity of the conductive pillar; and a storage capacitor, disposed over and electrically connected to the landing pad.

11. The memory device according to claim 10, further comprising:

a first contact structure, extending between and electrically connected to the active region and the bit line; and a second contact structure, extending between and electrically connected to the active region and the conductive pillar.

12. The memory device according to claim 11, wherein the first contact structure is shorter than the second contact structure.

13. The memory device according to claim 10, wherein a footprint area of the landing pad is greater than a footprint area of the conductive pillar.

14. The memory device according to claim 10, wherein an extending direction of the word line is intersected with an extending direction of the bit line and an extending direction of the active region.

* * * * *